US008837161B2

(12) United States Patent
Jafari et al.

(10) Patent No.: US 8,837,161 B2
(45) Date of Patent: Sep. 16, 2014

(54) MULTI-CONFIGURATION PROCESSOR-MEMORY SUBSTRATE DEVICE

(75) Inventors: Behdad Jafari, Saratoga, CA (US); George Sorenson, Fremont, CA (US)

(73) Assignee: Nvidia Corporation, Santa Clara, CA (US)

(*) Notice: Subject to any disclaimer, the term of this patent is extended or adjusted under 35 U.S.C. 154(b) by 0 days.

(21) Appl. No.: 10/197,385

(22) Filed: Jul. 16, 2002

(65) Prior Publication Data

US 2004/0012934 A1  Jan. 22, 2004

(51) Int. Cl.
H05K 1/11 (2006.01)
H05K 1/14 (2006.01)

(52) U.S. Cl.
USPC ............ 361/784; 361/764; 361/780; 361/782

(58) Field of Classification Search
USPC .............. 361/760–764, 790, 803; 365/51–53; 257/723–724
See application file for complete search history.

(56) References Cited

U.S. PATENT DOCUMENTS

| | | | | |
|---|---|---|---|---|
| 5,642,262 A | | 6/1997 | Terrill et al. ................... 361/783 |
| 5,710,733 A | * | 1/1998 | Chengson et al. ............... 365/52 |
| 5,742,477 A | | 4/1998 | Baba |
| 5,941,447 A | * | 8/1999 | Chu et al. .................. 228/180.21 |
| 5,974,493 A | * | 10/1999 | Okumura et al. ............. 710/307 |
| 5,978,281 A | | 11/1999 | Anand et al. |
| 5,999,437 A | | 12/1999 | Chengson et al. ............... 365/52 |
| 6,008,538 A | | 12/1999 | Akram et al. .................. 257/723 |
| 6,115,278 A | * | 9/2000 | Deneroff et al. ................. 365/52 |
| 6,209,075 B1 | * | 3/2001 | Lau ................................. 711/171 |
| 6,243,272 B1 | * | 6/2001 | Zeng et al. ..................... 361/760 |
| 6,285,558 B1 | * | 9/2001 | Frantz et al. .................. 361/760 |
| 6,301,121 B1 | * | 10/2001 | Lin ................................ 361/783 |
| 6,365,962 B1 | * | 4/2002 | Liang et al. .................... 257/668 |
| 6,424,034 B1 | | 7/2002 | Ahn et al. |
| 6,528,735 B1 | | 3/2003 | Bhatia et al. .................. 174/260 |
| 6,545,895 B1 | * | 4/2003 | Li et al. ............................ 365/52 |
| 6,580,611 B1 | * | 6/2003 | Vandentop et al. ........... 361/704 |
| 6,677,668 B1 | * | 1/2004 | Lin ................................ 257/685 |
| 6,882,546 B2 | * | 4/2005 | Miller ............................ 361/783 |
| 2002/0066956 A1 | | 6/2002 | Taguchi ........................ 257/734 |
| 2002/0081755 A1 | * | 6/2002 | Degani et al. ................... 438/14 |
| 2003/0216962 A1 | | 11/2003 | Heller et al. |

* cited by examiner

Primary Examiner — Tuan T Dinh

(57) ABSTRACT

A Multi-configuration Processor-Memory device for coupling to a PCB (printed circuit board) interface. The device comprises a substrate that supports multiple configurations of memory components and a processor while having a single, common interface with a PCB interface of a printed circuit board. In a first configuration, the substrate supports a processor and a first number of memory components. In a second configuration, the substrate supports a processor and an additional number of memory components. The memory components can be pre-tested, packaged memory components mounted on the substrate. The processor can be a surface mounted processor die. Additionally, the processor can be mounted in a flip chip configuration, side-opposite the memory components. In the first configuration, a heat spreader can be mounted on the memory components and the processor to dissipate heat. In the second, flip chip, configuration, the processor face can be soldered onto a non-electrically functional area of the PCB interface of the printed circuit board to dissipate heat.

12 Claims, 7 Drawing Sheets

CONFIGURATION A

COMMON PCB INTERFACE
160

CONFIGURATION B

CONFIGURATION A

CONFIGURATION B

MULTI-CONFIGURATION PROCESSOR-MEMORY SUBSTRATE DEVICE

FIELD OF THE INVENTION

The field of the present invention pertains to electronic integrated circuits. More particularly, the present invention relates to printed circuit board devices.

BACKGROUND OF THE INVENTION

Digital computer systems are being used today to perform a wide variety of tasks. Many different areas of business, industry, government, education, entertainment, and most recently, the home, are tapping into the enormous and rapidly growing list of applications developed for today's increasingly powerful computer devices.

Modern computer systems usually feature powerful digital processor integrated circuit devices. The processors are used to execute software instructions to implement complex functions, such as, for example, 3-D graphics applications, voice recognition, data visualization, and the like. The performance of many these applications is directly benefited by more powerful, more capable processors. Additionally, powerful modern computer systems have decreased in cost such that they are more available to an average user than ever before.

A primary characteristic of the increasing power of modern computer systems and their decreasing cost is the steady progress of integrated circuit device manufacturing technologies. Modern semiconductor manufacturing technologies lead to increasing levels of integration, increasing power, and decreasing cost of the computer devices (e.g., laptop computer systems, desktop computer systems, workstations, servers, etc.).

Computer system device manufacturers have discovered that compact size is a desirable market trait. Typically, the more compact a device is, the lower its costs of manufacture. Additionally, compact size (e.g. increasing integration) yields a number of other benefits, such as decreased power consumption and increased portability. Accordingly, a primary objective of many computer system device manufacturers is to reduce the form factor of a given device while maintaining, or even increasing, the performance of the device.

The objective of reducing computer system device form factor has led to several prior art integrated circuit packaging schemes. One prior art packaging scheme involves the implementation of multichip modules. A multichip module, or MCM, refers to a chip package that contains two or more "raw" chips closely connected with high-density lines, or signal traces embedded within, or on, the package. A raw chip generally refers to a semiconductor integrated circuit die without its associated packaging. The raw chips are typically mounted directly on or embedded within a base. A prior art MCM implementation saves space and can, in some cases, speed processing due to short leads between chips (e.g., in comparison to several discrete chips mounted conventionally on a printed circuit board). A ceramic base is typically used with chips wire bonded together (MCM-C) or with deposited thin film interconnects (MCM-D). MCMs have been mounted onto silicon substrates (MCM-S) and resin-based, laminated printed circuit boards (MCM-L), the latter, less-costly version evolving into the multichip package (MCP).

Another prior art packaging scheme involves the implementation of multichip packages. A multichip package, or MCP, refers to a chip package that contains two or more packaged chips, as opposed to raw chips. It is essentially an MCM that uses a laminated, printed circuit board-like substrate (MCM-L) rather than ceramic (MCM-C).

However, there are a number of problems with the above prior art packaging implementations. With both MCMs and MCPs, it is very difficult to route signal traces through the base or the substrate. For example, modern processor integrated circuit dies can have 500 or more interconnects which need to be coupled and routed through the substrate. In an MCM or MCP having a number of such dies, the routing problem can be very substantial.

Other problems arise from the increasing complexity forced upon the design of the substrate. The routing problem causes the design of the substrate to be much more complex. For example, to route thousands of different traces, many substrates are implemented in multiple layers and implement signal traces in a tightly packed manner, which can, in turn, cause another set of problems (e.g., crosstalk, uneven path delay, etc.). Additionally, highly complex substrates are difficult to manufacture. For example, high-performance MCMs mounting multiple chips have very tight manufacturing tolerances. The tight tolerances decrease the yield and reliability of the MCM. This increases the cost of the resulting computer system device. Another factor that increases cost is the use of raw chips. The raw chips must typically be mounted on the substrate and the device essentially finished prior to testing. Thus, it is difficult to detect defective dies prior to device completion. This reduces the overall yield of the device fabrication process.

Another problem with prior art MCM and MCP packaging implementations is the fact that with compactly packaged MCM/MCP devices, it becomes very difficult to manage heat dissipation. It is more difficult to effectively remove heat from the multiple chips. Additionally, the device can be thermally unbalanced wherein heat can spread from "hot" components to "cool" components, affecting their performance and reliability. Also, substrates and ceramic bases of devices are not a very good heat conductors. Consequently, prior art MCM/MCP devices can require complex heat sink apparatuses to maintain high performance levels. Most of the waste heat is required to transfer into the ambient air (e.g., requiring heat pipes, high air flow, noisy fans, etc.). As component packaging density increases and clock speed increases, the thermal energy that must be dissipated also increases. To maintain high-performance, a stable operating temperature must maintained. Accordingly, high performance prior art MCM/MCP devices must be configured for use with elaborate heat dissipation devices (e.g., heat sink fans, liquid cooling, heat spreaders, etc.). This increases the size of the overall package and can counteract a primary benefit of using an MCM/MCP design.

Thus, what is required is a solution that efficiently packages multiple integrated circuit components while maintaining cost effective packaging specifications. What is required is a solution that evidences favorable yield and performance characteristics along with a small package footprint.

SUMMARY OF THE INVENTION

Embodiments of the present invention provide a multi-configuration processor-memory device having a standardized interface for coupling to a printed circuit board. Embodiments of the present invention provide a solution that efficiently packages multiple integrated circuit components while maintaining cost effective packaging specifications. Additionally, embodiments of the present invention provide favorable yield and performance characteristics along with a small package footprint.

In one embodiment, the present invention is implemented as a Multi-configuration Processor-Memory device for coupling to a PCB interface of a printed circuit board. The device comprises a substrate that supports multiple configurations of memory components and a processor while having a single, common interface for connecting to an interface area of a printed circuit board (e.g., in one embodiment, a solder pad array disposed on the surface of the printed circuit board). In a first configuration, the substrate supports a processor and a first number of memory components. In a second configuration, the substrate supports a processor and an additional number of memory components (e.g., four or more memory chips). The memory components can be pre-tested, packaged memory components mounted on the substrate. The processor can be a surface mounted (or wire bonded) processor die. Additionally, the processor can be mounted in a flip chip configuration, side-opposite the memory components. In the first configuration (processor and memory components on the same side of the substrate), a heat spreader can be mounted on the memory components and the processor to dissipate heat. In the second, flip chip, configuration (processor and memory components on opposite sides of the substrate), the processor face can be soldered onto a non-electrically functional area of the PCB interface of the printed circuit board to dissipate heat and on the opposite side a heat spreader would simply dissipate heat for the memory components only.

In one embodiment, depending upon the specific configuration, the processor can be a GPU (graphics processing unit) and the memory components can be DDR (double data rate) memory components. The GPU can be a bare die mounted on the substrate, while the memory components are pre-tested, packaged memory components mounted on the substrate.

In another embodiment, the multi-configuration processor-memory device includes a heat spreader coupled to the memory components to conduct heat from the memory components independent of heat from a GPU. The GPU is mounted on the substrate in a flip chip configuration on a side of the substrate opposite the memory components. In this embodiment, the GPU includes a heat conduction surface configured for attaching to a heat sink, wherein the heat sink is configured to protrude through an opening of the printed circuit board and conduct heat from the GPU through the opening to a side of the printed circuit board opposite the GPU device, thereby providing a robust heat conduction path for the GPU that is independent of the heat spreader of the memory components.

In this manner, embodiments of the present invention implement a processor-memory device having a compact size and small form factor, resulting in lower manufacturing cost and much smaller application footprint. High-performance can be maintained since thermal dissipation from the memory components and the processor is decoupled, allowing higher clock speeds and more uniform heat dissipation. Additionally, the use of pre-tested, prepackaged memory components increases yield of the device fabrication process.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention provided a multi-configuration processor-memory device having a standardized interface for coupling to a printed circuit board. Embodiments of the present invention provide a solution that efficiently packages multiple integrated circuit components while maintaining cost effective packaging specifications.

Additionally, embodiments of the present invention provide favorable yield and performance characteristics along with a small package footprint.

Figure 1:
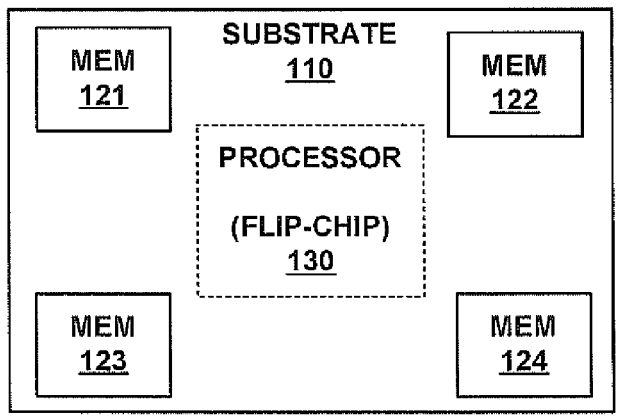
FIG. 1 shows a first configuration and a second configuration of a processor-memory device in accordance with one embodiment of the present invention.
Figure 1:
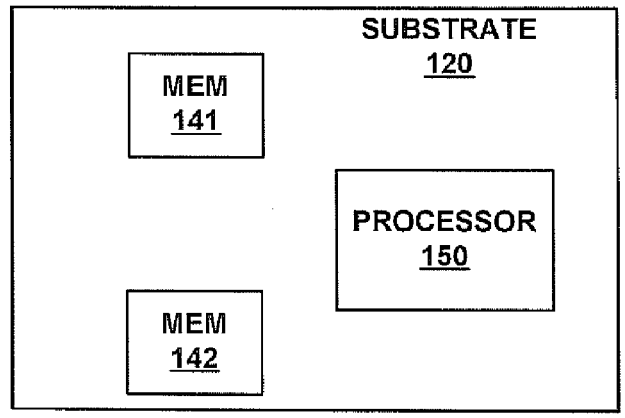

FIG. 1 shows a first configuration and a second configuration of a processor-memory device in accordance with one embodiment of the present invention. As shown in FIG. 1, the first configuration, configuration A, includes a processor 130 and a plurality of memory components 121-124 mounted on a substrate 110. The second configuration, configuration B, includes a processor 150 and a plurality of memory components 141-142 mounted on a substrate 120. Configuration A and configuration B are both designed to mount on a common PCB interface 160.

Referring still FIG. 1, embodiments of the present invention are designed to utilize a configurable substrate that is adapted to support multiple combinations and mounting configurations of processors and memory components while still maintaining a common interface to, for example, an interface area of a printed circuit board (e.g., motherboard, etc.). As shown in FIG. 1, configuration A has four memory components 121-124 and a single processor 130. Configuration B has 2 memory components 141-142 and a single processor 150. Both configurations utilize a common substrate interface that is designed to couple to the common PCB interface 160. It should be noted that embodiments can be configured to support other combinations of memory components and processor (e.g., one processor and one memory component, eight memory components, 16 memory components, etc.).

In one embodiment, the memory components 121-124 and 141-142 are prepackaged memory components. As used herein, prepackaged memory components refer to memory components that are not bare dies, or raw chips. The memory components are packaged in the conventional fashion and are tested prior to being mounted on the substrate 110 or the substrate 120. The use of prepackaged pre-tested memory components increases the yield of the overall device fabrication process in comparison to prior art MCM or MCP devices, which utilize raw chips. Additionally, the use of prepackaged memory components simplifies their acquisition process. For example: prepackaged memory components can be purchased from a greater number of vendors, providing better flexibility with respect to price and/or quality.

In the configuration A and B embodiments shown in FIG. 1, the memory components are surface mounted on the substrate 110 or 120. In configuration B, the processor 150 is surface mounted on the substrate 120 along with the memory components. In configuration A, the processor 130 is mounted on the substrate 110 in a flip-chip configuration, as shown by the dotted lines showing the outline of the processor 130.

In one embodiment, the processors 130 and 150 are GPUs (graphics processor units). In other embodiments, the processors 130 and 150 are other types of processors, such as, for example, DPSs (digital signal processors), CPUs (central processing units), or the like. Similarly, in one embodiment, the memory components 121-124 and 141-142 are DDR memory components. In other embodiments, the memory components 121-124 and 141-142 are other types of memory components, such as, for example, RDRAM memory components, SDRAM memory components, or the like.

Figure 2:
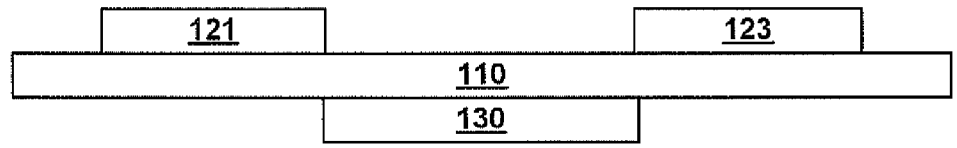
FIG. 2 shows a side view of the first configuration (configuration A) and the second configuration (configuration B) of the multi-configuration processor-memory device in accordance with one embodiment of the present invention.
Figure 2:
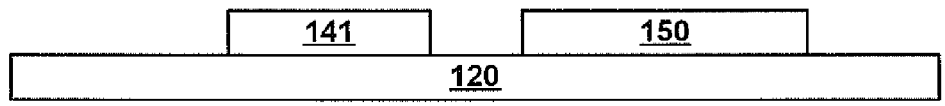

FIG. 2 shows a side view of configuration A and B of the multi-configuration processor-memory device in accordance with one embodiment of the present invention. As shown in FIG. 2, in configuration B, the processor 150 is surface mounted on the same side of the substrate 120. In configuration A, the processor 130 is mounted on the substrate 110 in a flip-chip configuration. In configuration A, the memory components 121-124 are surface mounted on the substrate while the processor 130 is flip-chip mounted on the side of the substrate opposite the memory components.

The flip-chip mounting of the processor 130 in configuration A provides an increased component density and smaller form factor. By flip-chip mounting the processor 130 on the side opposite the memory components, an additional number of memory components can be included within the same form factor. Similarly, for a given number of components, a smaller form factor can be implemented, having a smaller application footprint. The smaller form factor and increased component density leads to reduced manufacturing costs. Additionally, the flip chip configuration of the processor 130 simplifies the signal trace routing implementation for the substrate.

The flip-chip mounting of the processor 130 in configuration A allows the processor 130 to be cooled independently of the memory components 121-124. For example, the memory components 121-124 can be coupled to their own respective heat spreader or heat sink device. The processor 130 on the opposite side of the substrate 110 can utilize its own heat dissipation mechanism. This feature described in greater detail in FIG. 5A below.

Figure 3A:
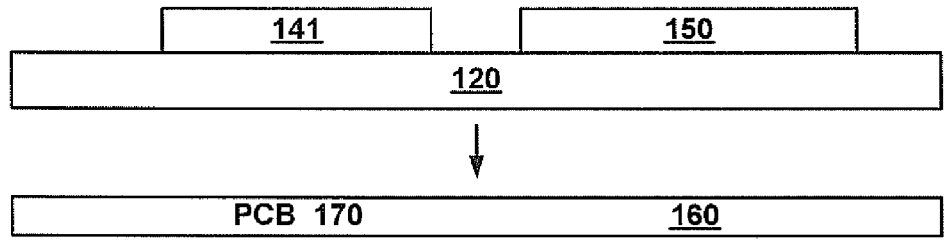
FIG. 3A shows a side view of the substrate of configuration B with respect to the common PCB interface of a PCB (printed circuit board) in accordance with one embodiment of the present invention.

FIG. 3A shows a side view of the substrate 120 of configuration B with respect to the common PCB interface 160 of a PCB (printed circuit board) 170. As described above, both configurations of the processor-memory device of the present embodiment include an interface designed to couple to the common PCB interface 160. The common PCB interface 160 functions by providing the electrical interconnection to the PCB 170. The attachment between the interface of substrate 120 and the common PCB interface 160 is typically implemented using solder. The common PCB interface can comprise a solder pad array for accepting solder interconnections with the substrate 120.

It should be noted that in this embodiment, the common PCB interface 160 is shown being generally flush with, or the same height as, the surface of the PCB 170. In other embodiments, the common PCB interface 160 can be at a different height than the surface of the PCB 170, for example, slightly raised with respect to the surface of the PCB 170 as shown in FIG. 5A and FIG. 6 below.

Figure 3B:
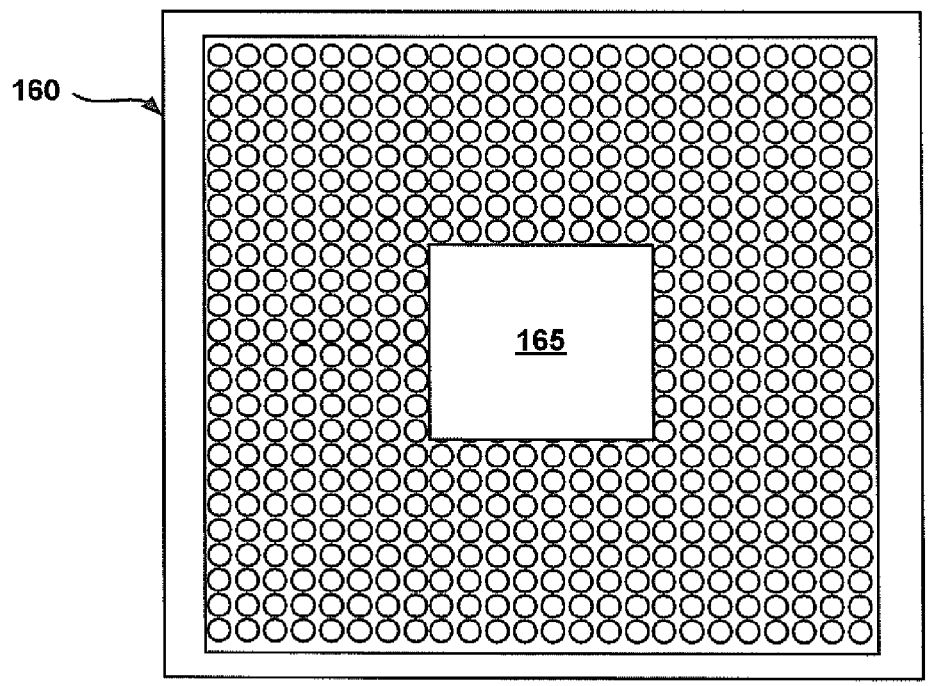
FIG. 3B shows a top down view of the common PCB interface in accordance with one embodiment of the present invention.

FIG. 3B shows a top down view of the common PCB interface 160 in accordance with one embodiment of the present invention. As shown in FIG. 3B, the common PCB interface 160 includes a solder pad array for accepting a plurality of solder interconnections (e.g., hundreds of interconnections) of the processor-memory device. In this embodiment, the common PCB interface 160 includes a nonfunctional area 165 located at the center of the solder pad array. The nonfunctional area 165 refers to the fact that there are no solder pad interconnections in this area which are electrically active or used by components on the PCB 170.

Figure 4:
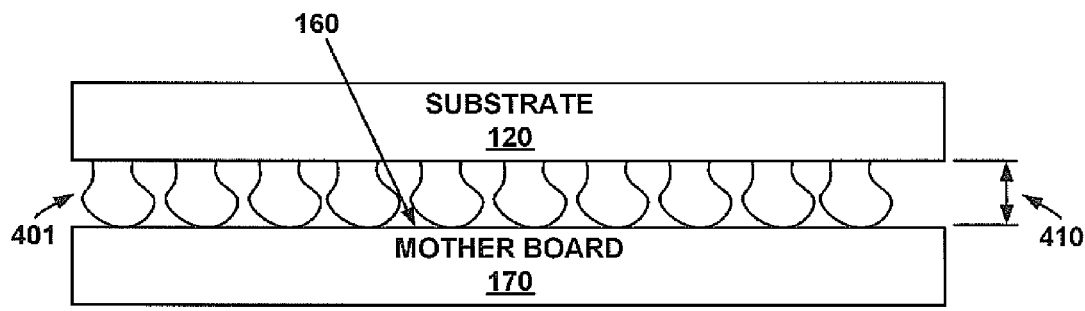
FIG. 4 shows a close-up side view of the solder interconnections between substrate and the common PCB interface in accordance with one embodiment of the present invention.

FIG. 4 shows a close-up side view of the solder interconnections between substrate 120 and the common PCB interface 160 of the PCB 170 in accordance with one embodiment of the present invention. As known by those skilled in the art, a plurality of solder interconnections 401 (e.g., solder balls 401) are used to couple the interface of substrate 120 to the solder pads of the common PCB interface 160. Once the solder interconnections are made, there remains a discrete distance 410 between the substrate 120 and the common PCB interface 160. In a typical implementation, the distance 410 is approximately 500 microns. This distance is sufficient to accommodate a flip chip mounted processor configuration as shown below in FIG. 5A.

Figure 5A:
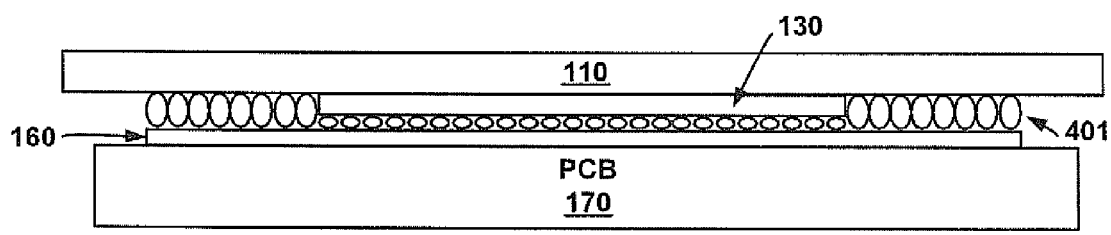
FIG. 5A shows a first side view of the solder interactions between the substrate, the flip-chip mounted processor, and the common PCB interface in accordance with one embodiment of the present invention.
Figure 6:
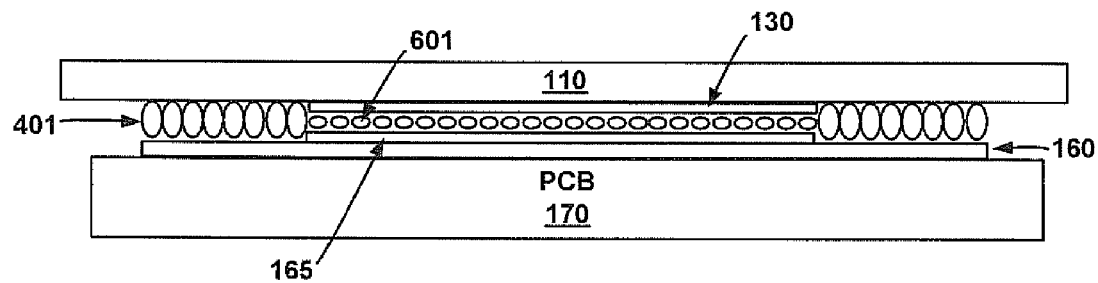
FIG. 6 shows a side view of an alternative embodiment wherein the solder balls are used for electrical interconnections and wherein an adhesive layer is used to attach the processor to the nonfunctional area of the common PCB interface.

FIG. 5A shows a side view of the solder interactions between the substrate 110, the flip-chip mounted processor 130, and the common PCB interface 160 in accordance with one embodiment of the present invention. FIG. 5A shows the solder interconnection of a configuration A embodiment of the processor-memory device.

In this embodiment, the plurality of solder balls 401 are used to connect the interface of the substrate 110 to the common PCB interface 160 in a manner similar to the connection between substrate 120 and common PCB interface 160 described above in FIG. 4. However, in addition to the solder balls 401 implementing electrical interconnections between the interface and the common PCB interface 160, a solder paste deposition (e.g., shown in greater detail in FIG. 5B below) also attaches the surface of the processor 130 to the nonfunctional area 165 of the common PCB interface 160. In this embodiment, the surface of the processor 130 is soldered directly to the nonfunctional area 165 to provide a heat conduction path, thereby enabling heat to be conducted directly away from the processor 130 into the common PCB interface 160 and the PCB 170.

In this manner, a surface of the processor 130 is configured for an attachment to the PCB interface 160 of the print circuit board in order to conduct heat from the processor through the attachment. In this embodiment, the attachment is a solder attachment. The distance 410 (e.g., approximately 500 microns) provides more than sufficient room between the interface of the substrate 110 and the PCB interface 160 for the flip-chip mounted processor 130, since the processor typically protrudes from the surface of the substrate 110 by approximately 350 microns.

The solder attachment shown in FIG. 5A allows the reflowed solder paste to conduct most of the heat from the processor 130 directly into the PCB 170. This provides a heat conduction path for the processor 130 independent of the memory components. The independent heat conduction paths thermally decouple the memory components from processor allowing separate heat dissipation paths, therefore resulting in more uniformly controlled low junction temperatures in all the mounted integrated circuit devices. Additionally, the PCB interface 160 is shown in FIG. 5A and FIG. 6 as being slightly raised above the surface of the PCB 170, in comparison to the flush, coplanar arrangement depicted in FIG. 3A.

Figure 5B:
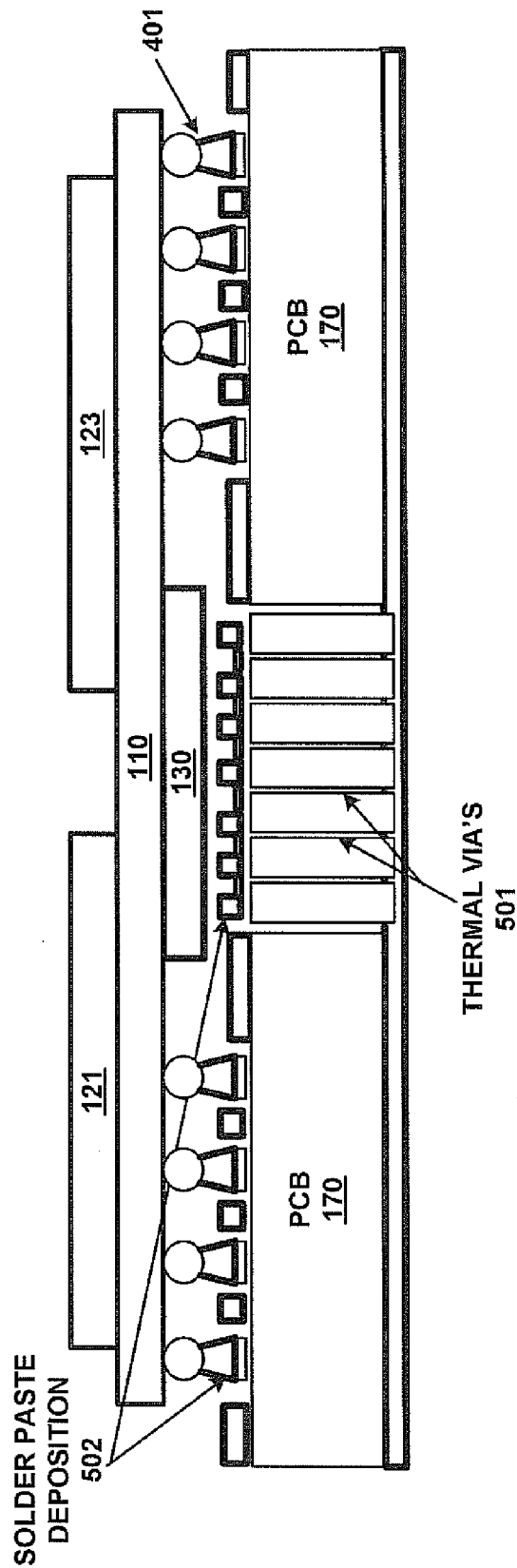
FIG. 5B shows a second side view of a PCB showing the relationship between a plurality of solder paste depositions and a plurality of solder balls in accordance with one embodiment of the present invention.

FIG. 5B shows a side view of the PCB 170 showing the relationship between a plurality of solder paste depositions 502 and the solder balls 401 in accordance with one embodiment of the present invention. In the embodiment depicted in FIG. 5B, solder paste depositions 502 are used to implement the attachment to the processor 130. Upon re-flow, the solder attachment shown in FIG. 5A is created from the solder paste depositions 502. In one embodiment, the solder balls 401 are typically standard size 0.63 mm solder balls. The FIG. 5B embodiment also shows a plurality of thermal vias 501 embedded within the PCB 501 to conduct heat away from the attachment to the processor 130.

FIG. 6 shows a side view of an alternative embodiment wherein the solder balls 401 are used for electrical interconnections and wherein an adhesive layer 601 is used to attach the processor 130 to the nonfunctional area 165 of the common PCB interface 160. The embodiment depicted in FIG. 6 is substantially similar to the embodiment shown in FIG. 5A, except a thermal adhesive layer 601 is used to attach a surface of the processor 130 and thereby implement a heat conduction path, as opposed to solder. As with the embodiment shown in FIG. 5A, the thermal adhesive layer 601 provides the independent heat conduction path for the processor 130.

Figure 7:
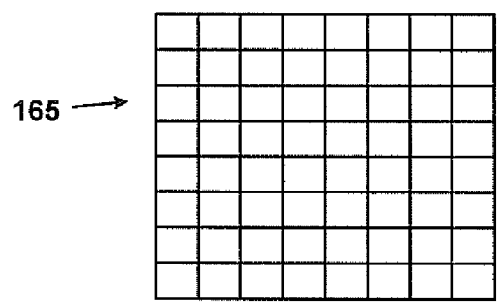
FIG. 7 shows the solder pads of the nonfunctional area of the common PCB interface disposed in a grid-like fashion in accordance with one embodiment of the present invention.
Figure 8:
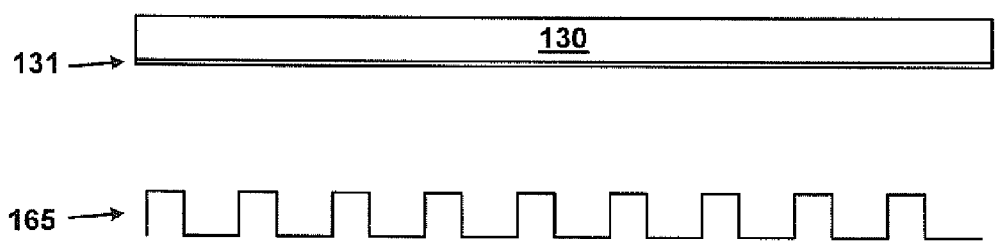
FIG. 8 shows a side view of the grid on the surface of the nonfunctional area in accordance with one embodiment of the present invention.
Figure 9:
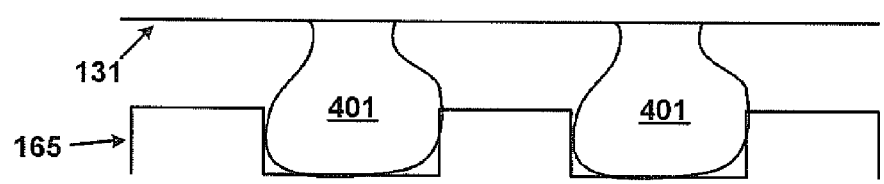
FIG. 9 shows a side view of the solder balls and the grid on the surface of the nonfunctional area in accordance with one embodiment of the present invention.

FIG. 7, FIG. 8, and FIG. 9 show more detailed views of the nonfunctional area 165 of the common PCB interface 160 in accordance with one embodiment of the present invention. As depicted in FIG. 7, the solder pads of the nonfunctional area 165 are disposed in a grid-like fashion. In this embodiment, the grid is implemented to prevent the solder balls 401, used to connect the surface of the processor 130, from spreading and possibly detaching from the surface of the processor 401.

Referring to FIG. 8, a side view of the grid on the surface of the nonfunctional area 165 is shown. FIG. 8 also shows a surface 131 of the processor 130 that is configured to attach to the nonfunctional area 165. In one embodiment, the surface 131 is a metalized surface (e.g., copper, etc.), or heat conduction surface, adapted to facilitate the conduction of heat away from the processor 130. Alternatively, the surface 131 can be a bare die surface.

Referring to FIG. 9, a side view of the solder balls 401 and the grid on the surface of the nonfunctional area 165 is shown. As described above, the grid is implemented to prevent solder balls 401 from spreading and possibly detaching from the surface 131 of the processor 130. The "ridges" of the grid extend upwards approximately 20 to 30 microns from the surface of the area 165.

In one embodiment, the grid is implemented using a "solder-mask" material. The solder mask material can be applied to the surface of the nonfunctional area 165, and thereby implement the grid pattern, during the same manufacturing step as other solder mask features are implemented on the surface of the PCB 170. The material comprising the grid can be a polymer material as used in a typical SMOBC (solder mask over bare copper) process. Alternatively, in another embodiment, the grid can be implemented by etching the surface (e.g., copper) of the nonfunctional area 165.

Figure 10:
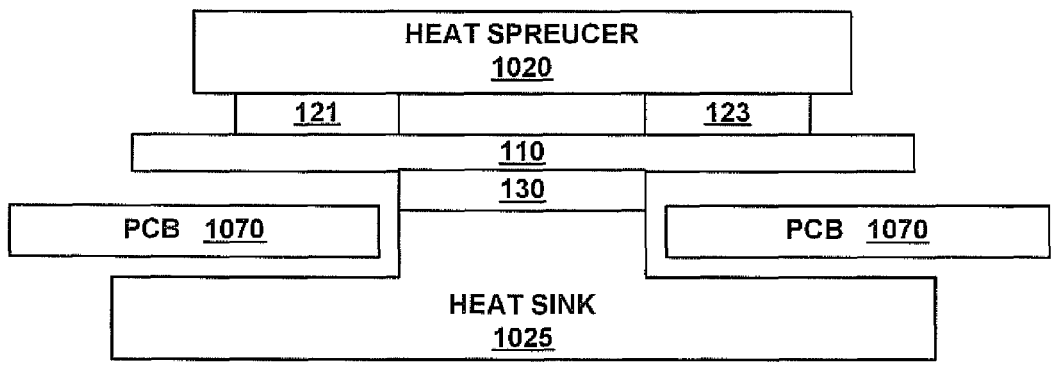
FIG. 10 shows a processor-memory device implementation in accordance with an alternative embodiment of the present invention, wherein a flip-chip configuration of the processor-memory device is mounted to a heat sink that is designed to attach to the processor through an opening within a PCB.

FIG. 10 shows a processor-memory device implementation in accordance with an alternative embodiment of the present invention. In this embodiment, a flip-chip configuration (e.g., configuration A) of the processor-memory device is mounted to a heat sink 1025 that is designed to attach to the processor 130 through an opening (e.g., hole) within a PCB 1070.

In this embodiment, the multi-configuration processor-memory device includes a heat spreader 1020 coupled to the memory components to conduct heat from the memory components independent of heat from the processor 130. The processor 130 is mounted on the substrate in a flip-chip configuration on a side of the substrate opposite the memory components. In this embodiment, the processor 130 includes a heat conduction surface configured for attaching to the heat sink 1025. The heat sink 1025 is configured to protrude through an opening of the 1070 and conduct heat from the processor 130 through the opening to a side of the PCB 1070 opposite the processor 130 device, thereby conducting heat away from the processor 130 in a manner independent of the memory components (which use the heat spreader 1020). The surface of the processor is mounted to the heat sink 1025 as opposed to the nonfunctional area 165 of the common PCB interface 160. The electrical interconnections of the common PCB interface 160 would be disposed along the periphery of the opening within the PCB 1070.

This embodiment provides the advantage of a very robust heat transfer device (e.g., heat sink 1025) coupled to the processor 130. This allows the processor 130 to generate a much greater amount heat than otherwise possible, thereby allowing higher clock speeds, greater performance, and the like. The heat sink 1025 can optionally include a fan to increase airflow, thereby dissipating an even greater amount heat from the processor 130.

Thus, embodiments of the present invention provide a multi-configuration processor-memory device having a standardized interface for coupling to a printed circuit board.

Embodiments of the present invention provide a solution that efficiently packages multiple integrated circuit components while maintaining cost effective packaging specifications. Additionally, embodiments of the present invention provide favorable yield and performance characteristics along with a small package footprint. High performance can be maintained since thermal dissipation from the memory components and the processor is decoupled, allowing higher clock speeds and more uniform heat dissipation. Additionally, the use of pre-tested prepackaged memory components increases yield of the device fabrication process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A Multi-configuration Processor-Memory device for coupling to a PCB (printed circuit board) interface of a printed circuit board comprising:

a substrate having both a first configuration and a second configuration, wherein the substrate mounts a processor and a second number of memory components in the second configuration, and mounts another processor and a different number of memory components in the first configuration, wherein in the second configuration both the processor and the memory components are positioned on the same side of the substrate and the other side of the substrate is free of electronic components and in the first configuration the another processor and the different number of memory components are positioned on different sides of the substrate; and an interface comprising a plurality of solder balls built into the substrate, wherein the plurality of solder balls surface mount the substrate to a PCB interface of a printed circuit board;

wherein the second number of memory components of the second configuration is two memory components and the different number of memory components of the first configuration is at least four memory components.

2. The device of claim 1 wherein the memory components and the processor are soldered onto the substrate.

3. The device of claim 1 wherein the processor is mounted on the substrate in a flip chip configuration.

4. The device of claim 3 wherein the processor is mounted on the substrate in a flip chip configuration on an opposite side of the substrate mounting the memory components.

5. The device of claim 1 wherein the processor is a GPU (graphics processor unit).

6. The device of claim 1 wherein the memory components are DDR (double data rate) memory components.

7. The device of claim 6 wherein the memory components are packaged memory components.

8. The device of claim 1 wherein the processor is mounted on the substrate in a flip chip configuration on the same side of the substrate as the interface.

9. The device of claim 8 wherein a surface of the processor is configured for an attachment to an area of the PCB interface of the printed circuit board to conduct heat from the processor through the attachment.

10. The device of claim 9 wherein the attachment is a solder attachment.

11. The device of claim 9 wherein the attachment is an adhesive attachment.

12. The device of claim 1 wherein the memory components are configured to receive a heat spreader to conduct heat from the memory components.

* * * * *